United States Patent
Daga et al.

(10) Patent No.: US 6,608,787 B1
(45) Date of Patent: Aug. 19, 2003

(54) SINGLE-ENDED CURRENT SENSE AMPLIFIER

(75) Inventors: Jean Michel Daga, Aix en Provence (FR); Caroline Papaix, Rousset (FR); Jeanine Guichaoua, Fuveau (FR)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 10/121,377

(22) Filed: Apr. 11, 2002

(51) Int. Cl.[7] ............................. G11C 7/02; H03F 3/45
(52) U.S. Cl. .................... 365/203; 365/227; 365/205; 365/202; 327/52; 327/53
(58) Field of Search ................ 365/189.01, 203, 365/202, 205, 204, 227, 226; 327/52, 53

(56) References Cited

U.S. PATENT DOCUMENTS

| | | | |
|---|---|---|---|
| 4,918,341 A | 4/1990 | Galbraith et al. | 307/530 |
| 5,013,943 A | 5/1991 | Hirose | 307/530 |
| 5,388,078 A * | 2/1995 | Arakawa | 365/203 |
| 5,555,215 A * | 9/1996 | Nakagome et al. | 365/226 |
| 5,666,310 A | 9/1997 | Yu et al. | 365/185.21 |
| 5,710,739 A * | 1/1998 | Calligaro et al. | 365/205 |
| 5,872,739 A * | 2/1999 | Womack | 365/207 |
| 6,122,212 A * | 9/2000 | Bui et al. | 365/207 |
| 6,188,625 B1 * | 2/2001 | Kawabata et al. | 365/207 |
| 6,191,979 B1 * | 2/2001 | Uekubo | 365/185.25 |
| 6,194,919 B1 * | 2/2001 | Park | 327/52 |
| 6,337,824 B1 * | 1/2002 | Kono et al. | 365/207 |

\* cited by examiner

Primary Examiner—Viet Q. Nguyen
(74) Attorney, Agent, or Firm—Thomas Schneck

(57) ABSTRACT

A single-ended sense amplifier having a precharge circuit for maintaining a stable voltage on a bitline, a sensing circuit coupled to the bitline for sensing an amount of current flowing into the bitline, a direct current amplification circuit electrically coupled to the sensing circuit for amplifying the current sensed on the bitline, a current-to-voltage conversion circuit for converting the sensed current to a voltage and a voltage amplification circuit for amplifying the voltage at the sense amp output. The sense amplifier can be implemented using standard CMOS components and provides improved access time at low power supply voltage, high robustness to process variations, and the ability to sense very low currents.

22 Claims, 2 Drawing Sheets

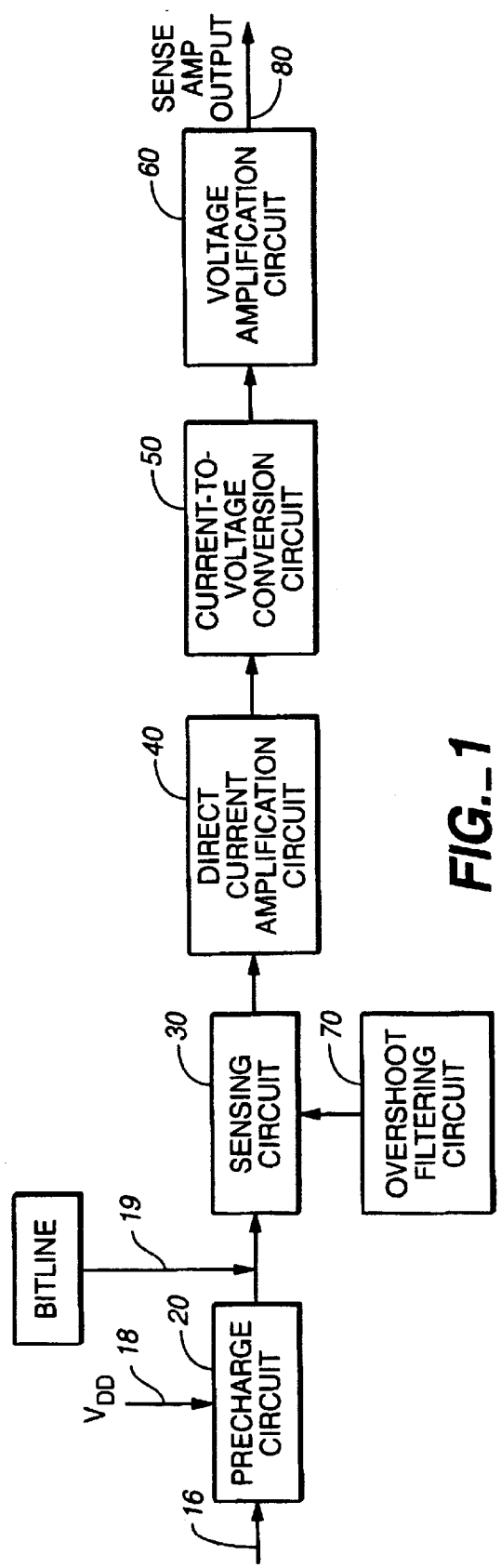
FIG._1

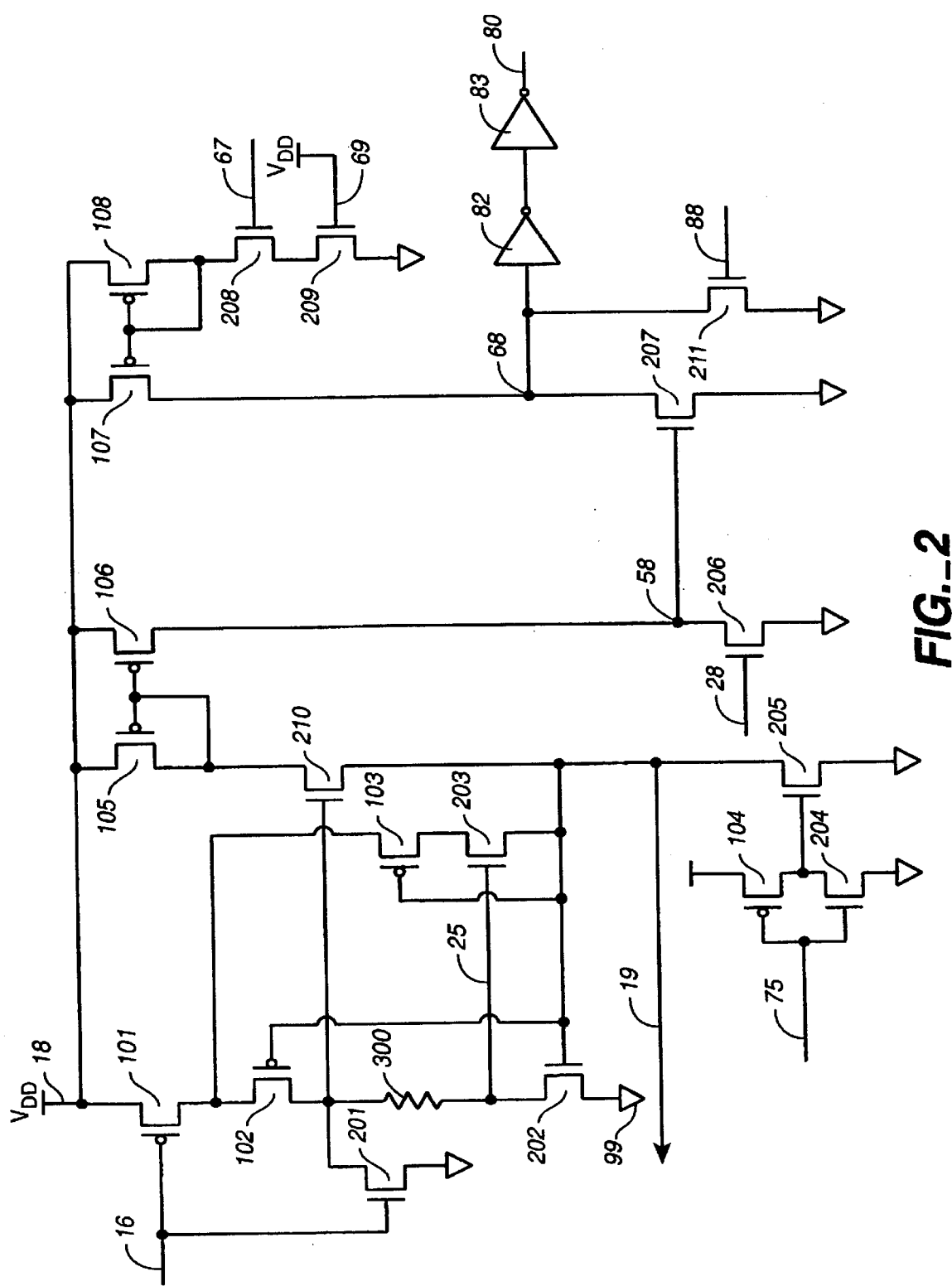
FIG._2

SINGLE-ENDED CURRENT SENSE AMPLIFIER

TECHNICAL FIELD

The present invention relates to sense amplifier circuits for use in memory integrated circuits.

BACKGROUND ART

In memory integrated circuits, sense amplifiers are used to detect and determine the data content of a selected memory cell. In EEPROM (Electronically Erasable Programmable Read Only Memories) and Flash memories, the sense amplifier serves two functions. Firstly, the sense amplifier precharges the bitline to a clamped value, and secondly, it senses the current flowing into the bitline, which depends on the memory cell state. Both the reliability, in terms of endurance and retention, and the performance depend to greatly on the design of the sense amplifier.

The majority of integrated sense amplifier structures are based on a differential amplifier being used to compare the current coming from the selected memory cell to the current of a reference cell. The reference cells can be implemented in different ways, and are of different types. The reference cells are programmed one time only during the test of the memory, thus increasing the testing time. In order to ensure the good functionality of the sense amplifier, the ratio Icell/Iref must be maintained high enough to take into account the process fluctuations on the memory and the reference cells, and the impact of the memory cycling on the memory cells. Moreover, it has been shown that the speed performance and reliability of the standard differential amplifier sense amplifiers are highly reduced for supply voltage values under 2V.

Other types of sense amplifier structures are nondifferential types that have nonsymmetrical circuits which detect and amplify signals which are generated by an accessed memory cell on a single amplifier input node. These types of sense amplifiers are often referred to as "single-ended". Among the single-ended sense amplifiers of the prior art is U.S. Pat. No. 4,918,341 to Galbraith et al. which discloses a single-ended sense amplifier that includes a complementary current mirror circuit that converts a single-ended input current into a single-ended output voltage. The '341 patent also discloses a circuit for filtering high frequency noise spikes. U.S. Pat. No. 5,013,943 to Hirose discloses a single-ended sense amplifier having a precharging circuit in order to lessen the effect of changing the bitline capacitance and the variability in the current conducted by the cell. U.S. Pat. No. 5,666,310 to Yu et al. discloses a sense amplifier circuit that senses the current drawn by the memory array and changes the state of the output once a certain current has been reached.

The trend in recent years is to design memory circuits that consume less power. One way to do this is to decrease the voltages of the power supplies that provide power to the memory. As the power supply voltages used for sense amplifiers decrease, it becomes more important that the sense amplifier be able to sense very low current levels.

It is the object of the present invention to provide a single-ended sense amplifier having direct current amplification in order to sense very low currents.

It is a further object of the invention to provide a single-ended sense amplifier that can be designed using standard low voltage CMOS devices.

SUMMARY OF THE INVENTION

The above objects have been achieved by a single-ended current sense amplifier having a precharge circuit to maintain a stable voltage on a bitline, a sensing circuit coupled to the bitline for sensing an amount of current flowing into the bitline, a direct current amplification circuit coupled to the sensing circuit for amplifying the current sensed on the bitline, a current-to-voltage conversion circuit for converting the sensed current to a voltage, and a voltage amplification circuit for amplifying the voltage at the sense amplifier output. The sense amplifier also includes an overshoot filtering circuit to filter out positive glitches on the bitline.

The single-ended structure provides the advantage of eliminating the need to have a reference cell and a comparator circuit as are commonly used in the differential sense amp structures. This provides a savings in testing time and in the amount of die area used by the sense amplifier circuit. Additionally, the single-ended structure provides other advantages over the standard differential structures such as providing less sensitivity to mismatching and process variations and providing improved access time at low supply voltages.

By providing direct current amplification immediately following the current sensing, the sense amplifier of the present invention is faster and can sense very low currents compared to other single-ended sense amplifiers of the prior art.

BRIEF DESCRIPTION OF THE DRAWINGS

FIG. 1 is a block diagram of the structure of the sense amplifier circuit of the present invention.

FIG. 2 is an electrical schematic diagram of the sense amplifier circuit of FIG. 1.

BEST MODE FOR CARRYING OUT THE INVENTION

With reference to FIG. 1, the sense amplifier of the present invention includes a precharge circuit 20, which functions to precharge and maintain a stable voltage on the bitline 19. The precharge circuit 20 receives a power supply voltage Vdd 18 at an input terminal and a sense on/off signal 16 at another input terminal to activate the sense amplifier circuit. A sensing circuit 30 is coupled to the bitline 19 and is used to sense the current flowing into the bitline. An overshoot filtering circuit 70 is coupled to the sensing circuit 30 in order to filter out positive glitches on the bitline. The output of the sensing circuit 30 goes to a direct current amplification circuit 40 which amplifies the current that was sensed by the sensing circuit. The amplified current is converted into a voltage by the current-to-voltage conversion circuit 50 and then the resulting voltage is amplified by the output amplification stage 60 and is provided to the sense amplifier output 80.

With reference to FIG. 2, the precharge circuit consists of transistors 101, 102, 103, 202, 203 and resistor 300. Transistors 101, 102 and 103 are PMOS type transistors while transistors 202 and 203 are NMOS type transistors. Transistor 101 has a gate input connected to the sense amplifier on/off signal input terminal 16, a source terminal coupled to the power supply voltage Vdd 18, and a drain terminal connected to the source terminal of PMOS transistor 102. Transistor 102 has a drain terminal coupled to the first end of resistor 300, and a gate terminal coupled to the gate of transistor 202. Transistor 202 has a drain terminal connected to the second end of resistor 300 and a source terminal connected to ground potential 99. Transistor 103 has a gate terminal connected to the gate terminal of transistor 202, a source terminal connected to the drain terminal of transistor 101, and a drain terminal connected to the drain of transistor 203. Transistor 203 has a source terminal connected to the gate of transistor 202 and a gate terminal connected between the drain terminal of transistor 202 and the second end of resistor 300. The precharge circuit functions to precharge and maintain a stable voltage on the bitline 19. The bitline 19 is connected to the source terminal of transistor 203, as shown in FIG. 2. The branch consisting of transistors 101, 103 and 203 must drive enough current to set the bitline 19 to its clamped voltage in a limited amount of time. The clamped precharge voltage is determined by the sizing of transistors 102 and 202 and the size of the resistor 300. When the bitline reaches the trip point of the 102, 202 and the resistor 300 stage, the bias low line 25 goes low, turning off transistor 203, and thus turning off the precharge branch.

The sensing circuit consists of NMOS transistor 210, and PMOS transistors 105 and 106. Transistor 210 has a gate terminal connected to the drain terminal of transistor 201, a drain terminal connected to the drain terminal and gate terminal of transistor 105 and to the gate terminal of transistor 106, and a source terminal connected to the bitline. Transistors 105 and 106 have gate terminals connected to the drain terminal of 105, and source terminals connected to the power supply voltage Vdd. The drain terminal of transistor 106 is connected to the drain terminal of NMOS transistor 206. Transistor 206 has a gate terminal 28 connected to a sense mode enable signal, and a source terminal connected to a ground potential. Transistor 210 serves to isolate the bitline voltage from the gate level of transistor 105, which allows the potential on the bitline to be imposed by the precharge circuit. Transistor 106 mirrors the cell current multiplied by a factor of N. Thus, the cell current is directly amplified and is supplied to the drain of the low drive 206 transistor, resulting in current-to-voltage conversion and a first voltage V1 at node 58. Transistor 206 has a low W/L value and the current trip point of the sense amplifier can be adjusted by varying the multiplication factor N and the size of the transistor 206.

The converted voltage V1 is amplified by the voltage amplification circuit consisting of PMOS transistors 107 and 108, and NMOS transistors 207, 208 and 209. Transistor 107 has a source terminal connected to the power supply voltage Vdd 18 and a drain terminal connected to the drain terminal of transistor 207. Transistor 207 has a gate terminal connected to node 58 to receive the voltage V1, and a source terminal connected to a ground potential. Transistors 107 and 207 amplify the voltage V1 to produce an amplified voltage V2 at a node 68. Transistors 108, 208, and 209 act as a bias current generator. Transistor 208 has a source terminal connected to the power supply voltage Vdd 18, and a gate terminal connected to its drain terminal and also to the gate terminal of transistor 107. Transistor 208 has a drain terminal connected to the drain terminal of transistor 108, and a gate terminal 67 connected to a sense mode enable signal. Transistor 209 has a drain terminal connected to the source of transistor 208, a gate terminal 69 connected to a power supply voltage Vdd and a source terminal connected to a ground potential. The bias current generator generates a bias current which is supplied through transistor 207 to the node 68. The voltage V2 goes through a pair of inverters 82, 83, serving as output buffers, and the output of the sense amplifier is produced at terminal 80.

NMOS Transistors 201 and 211 are used to turn the sense amplifier off in stand by mode, or in the mode where there is no DC current. Transistor 201 has a drain terminal connected to the gate terminal of transistor 210 and to the source terminal of transistor 102 and to the first end of resistor 300. Transistor 201 also has a source terminal connected to ground potential, and a gate terminal 88 connected to sense on/off signal input terminal. Transistor 211 has a drain terminal connected to node 68, a source terminal connected to ground potential, and a gate terminal 88 connected to the sense on/off signal.

Additionally, the sense amplifier also includes an overshoot filtering circuit consisting of PMOS transistor 104 and NMOS transistors 204 and 205. Transistors 104 and 204 are connected as an inverter with the source of transistor 104 being connected to a power supply Vdd, the drain of 204 being connected to the drain of transistor 204, the source of transistor 204 being connected to a ground potential, and the gates of transistors 104 and 204 being connected together and being supplied with a bias high signal at the gate terminal 75. The output of the 104, 204 inverter is connected to the gate of transistor 205. Transistor 205 has a drain terminal connected to the bitline 19 and a source terminal connected to the ground potential. Due to the sense environment, overshoots can occur on the bitline that can affect the normal sensing operation. The overshoot filtering circuit serves to filter positive glitches on the bitline. In the case of a positive glitch on the bitline, the bias high signal goes low which produces a high signal at the output of inverter 104, 204. This high signal turns on transistor 205 which discharges the glitch. Compared to the usual prior art structures that use a transistor in diode, this solution has the advantage to drive current in the transistor 205 only if there is an overshoot on the bitline 19.

The following is the description of the circuit according to the inputs. When the sense on/off signal 16 is off, the sense on/off signal is set high while the sense mode enable signal 28 is set low. The high sense mode enable signal turns on transistor 211, placing a low potential on node 68, and setting the output 80 of the sense amplifier to a low state. In this situation, there is no DC current in the structure. When the sense on/off signal is on, meaning that DC current is flowing, the sense on/off signal goes low and the sense mode enable signal goes high. The low signal turns on transistor 101 and turns off transistor 201. This allows current to flow through transistors 103, 203 and 210 and thus start the precharge circuit. As explained above, the precharge circuit will set the bitline 19.

In order to read an ON cell, or a "0", transistor 206 must drive a large current equal to the current generated from the drain of transistor 106 in order for the voltage V1 at its drain to rise. The variation of voltage V1 is then amplified by the voltage amplification circuit (transistors 107 and 207) and the output voltage V2 at node 68 quickly goes low, providing a low signal, or "0", on the sense amplifier output 80.

In order to read a OFF cell, or a "1", the transistor 206 has no current to drive so the voltage V1 at node 58 goes low. This turns off transistor 207 and the voltage V2 at node 68 increases strongly, producing a high output at the sense amplifier output 80.

The sizing of the sense amplifier will be driven by two objectives, the first objective is to meet the targeted current trip point limit. This is obtained through a DC analysis. The second objective is to achieve the performance target in terms of access time and power. To determine these objectives, a first order modeling of the structure is needed. This first order modeling is described herein.

The first step in this process is to use DC modeling to calculate the current trip point. The sense amplifier switches from 1 to 0 when node 58 reaches the output stage trip point. For the purpose of simplification, an assumption is made that the output stage trip point is equal to the threshold voltage ($V_{TN}$) of transistor 207. When V1 varies from 0 to $V_{TN}$, transistor 206 is in linear mode, acting as a resistance. The condition to determine the current trip point limit (Ilim) is as following:

$$R_{206} n I_{\lim} = V_{TN} \text{ where } R_{206} = \frac{1}{\mu Cox \left(\frac{W}{L}\right)_{206} (V_{DD} - V_{TN})},$$

giving the following expression for Ilim:

$$I_{\lim} = \frac{1}{n} \mu \left( Cox \left(\frac{W}{L}\right) \right)_{206} (V_{DD} - V_{TN}) V_{TN}$$

This expression exhibits a linear variation with respect to VDD. As the mobility $\mu$ and threshold voltage $V_{TN}$ decrease with temperature, a decrease of Ilim with temperature is expected. Finally, it appears clearly that the current trip point can be fixed by tuning the multiplication factor n of the current mirror and the sizing of the transistor 206.

Next, dynamic analysis is used to calculate the switching time. Both falling delay (reading an ON memory that drives $I_{ON} > I_{lim}$) and rising delay (reading an OFF cell that drives $I_{OFF} < I_{lim}$) must be considered for the dynamic analysis. The total switching delay can be divided into four contributions: the precharge delay, the time necessary to start the current mirror, the time necessary to charge/discharge the node 58 (V1), and the time needed to charge/discharge the node 68 (V2). For reasonable multiplication factor values (n<3), the current mirror starting time is negligible. The assumption is made that the voltage V2 at node 68 is the output of the sense, the delay in the output buffers 82, 83 being negligible.

When reading an ON memory cell, the voltage V1 at node 58 is charged through the unbalance current $nI_{on} - I_{206}$, and the voltage V2 at node 68 is discharged through the unbalance current $I_{207} - I_{bias}$. So the read on cell delay can be written as:

$$T_{rdON} = t_{precharge} + (C_{G207} + C_{par1}) \frac{V_{TN}}{nI_{on} - I_{206}} + (C_{INV1} + C_{par2}) \frac{V_{DD}/2}{I_{207} - I_{bias}}$$

where $t_{precharge}$ is the precharge delay that can be adjusted by sizing the transistors 103 and 203, $C_{G207}$ is the gate capacitance of transistor 207, $C_{INV1}$ the input capacitance of inverter 82, Cpar1 is the total parasitic capacitance on node 58, including the drain capacitance of transistors 206 and 106 as well as the routing, and Cpar2 is the total parasitic capacitance on node 68 including the drain capacitance of transistors 207 and 107, as well as the routing. $I_{206}$ and $I_{207}$ are the current flowing through transistors 206 and 207 respectively.

When reading an OFF memory, the V1 node 58 is discharged through the current $I_{206}$, while the V2 node 68 is charged through the current $I_{bias}$. More precisely, when V1 switches from $V_{DD}$ to $V_{TN}$ the output voltage V2 starts rising due to the unbalance current $I_{bias} - I_{N7}$. This is neglected for the first order modeling. The read OFF cell delay can be written as:

$$T_{rdOFF} = t_{precharge} + (C_{G207} + C_{par1}) \frac{V_{DD} - V_{TN}}{I_{206}} + (C_{INV1} + C_{par2}) \frac{V_{DD}/2}{I_{bias}}$$

These equations give an indication on how the sense must be sized: First, adjust factor n and the length of the minimum width transistor 206 in order to meet the trip point target. Then, decrease the dimensions of INV1 82 in order to minimize the capacitance on V2 node 68 ($C_{INV1}$). Then, size transistor 207 and Ibias in order to minimize and balance the read ON and read OFF cell delays. In order to limit the capacitance on V1 node 58, transistor 207 must be sized as small as possible.

The above described sense amplifier provides many advantages including a high robustness to process variations, improved access time at low power supply voltages, and a full and easy implementation using low voltage CMOS devices.

What is claimed is:

1. A current sense amplifier comprising:
   a precharge circuit receiving an activation signal and a first power supply voltage and producing a precharge voltage on a bitline;
   a sensing circuit coupled to the bitline and having means for sensing an amount of current flowing into the bitline;
   a current amplification circuit electrically coupled to the sensing circuit and having means for amplifying the current sensed on the bitline;
   a current-to-voltage conversion circuit electrically coupled to the current amplification circuit and having means for converting the sensed current to a first voltage; and
   a voltage amplification circuit electrically coupled to the current-to-voltage conversion circuit and having means for amplifying the first voltage to produce a second voltage at a sense amplifier output.

2. The sense amplifier of claim 1 further including means for isolating the precharge voltage on the bitline from the sensing circuit.

3. The sense amplifier of claim 1 further comprising an overshoot filter circuit coupled to the bitline, said overshoot filter having means for filtering glitches on the bitline.

4. The sense amplifier of claim 3 wherein the overshoot filter includes a first inverter which receives a bias signal indicating a glitch at an input and produces an inverted bias signal at an output, and a discharge transistor having a gate terminal electrically coupled to the output of the first inverter, a drain terminal electrically coupled to the bitline and a source terminal electrically coupled to a ground potential.

5. The sense amplifier of claim 1 wherein the precharge circuit clamps the precharge voltage on the bitline to a value that is lower than the value of the first power supply.

6. The sense amplifier of claim 1 further including a first input terminal for receiving the activation signal and a second input terminal for receiving the first power supply voltage.

7. The sense amplifier of claim 6 wherein the precharge circuit includes:
   a first resistor;
   a first PMOS transistor (101) having a gate electrically coupled to the first input terminal and a source terminal electrically coupled to the second input terminal;
   a second PMOS transistor (102) having a source terminal electrically coupled to the drain terminal of the first PMOS transistor, and a drain terminal electrically coupled to a first end of the first resistor;

a first NMOS transistor (202) having a gate terminal electrically coupled to the bitline, a drain terminal electrically coupled to a second end of the first resistor and a source terminal electrically coupled to a ground potential;

a third PMOS transistor (103) having a gate terminal electrically coupled to the bitline, and a source terminal electrically coupled to the drain terminal of the first PMOS transistor; and a second NMOS transistor (203) having a source terminal electrically coupled to the bitline, a gate terminal electrically coupled to the second end of the first resistor, and a drain terminal electrically coupled to the drain terminal of the third PMOS transistor.

8. The sense amplifier of claim 6 wherein the sensing and current amplification circuits include:

a third input terminal for receiving a sense mode enable signal;

a fourth PMOS transistor (105) having a source terminal electrically coupled to the second input terminal;

a fifth PMOS transistor (106) having a source terminal electrically coupled to the second input terminal, a gate terminal electrically coupled to the gate terminal of the fourth PMOS transistor, and a drain terminal electrically coupled to a first voltage node (V1);

a third NMOS transistor (206) having a gate terminal electrically coupled to the third input terminal, a source terminal electrically coupled to the ground potential, and a drain terminal electrically coupled to the first voltage node;

a fourth NMOS transistor (210) having a drain terminal electrically coupled to the drain terminal of the fourth PMOS transistor, a source terminal electrically coupled to the bitline; and a fifth NMOS transistor (201) having a drain terminal electrically coupled to the gate of the fourth NMOS transistor, a source terminal electrically coupled to the ground potential, and a gate terminal electrically coupled to the first input terminal to receive the activation signal.

9. The sense amplifier of claim 6 wherein the voltage amplification circuit includes:

a bias current generator circuit;

a sixth NMOS transistor (207) having a gate terminal electrically coupled to a first voltage node (58), a source terminal electrically coupled to a ground potential, and a drain terminal electrically coupled to a second voltage node (68);

a sixth PMOS transistor (107) having a source terminal electrically coupled to the second input terminal, a gate terminal electrically coupled to the bias current generator circuit, and a drain terminal electrically coupled to the second voltage node.

10. The sense amplifier of claim 9 wherein the bias current generator circuit includes:

a fourth input terminal for receiving a sense mode enable signal;

a seventh PMOS transistor (108) having a drain terminal, a source terminal electrically coupled to the second input terminal, and a gate terminal electrically coupled the a drain terminal;

a seventh NMOS transistor (208) having a source terminal, a drain terminal electrically coupled to the drain terminal of the seventh PMOS transistor, and a gate terminal electrically coupled to the fourth input terminal; and an eighth NMOS transistor (209) having a drain terminal electrically coupled to the source terminal of the seventh NMOS transistor, a gate terminal electrically coupled to the second input terminal, and a source terminal electrically coupled to a ground potential.

11. The sense amplifier of claim 9 wherein the voltage amplification circuit further includes a plurality of inverters electrically coupled between the second voltage node and the sense amplifier output.

12. The sense amplifier of claim 9 further including a ninth NMOS transistor (211) having a gate terminal electrically coupled to the first input terminal, a drain terminal electrically coupled to the second voltage node, and a source terminal electrically coupled to the ground potential.

13. A current sense amplifier comprising:

a precharge circuit receiving an activation signal and a first power supply voltage and producing a precharge voltage on a bitline;

a sensing circuit electrically coupled to the bitline and having means for sensing an amount of current flowing into the bitline;

means for isolating the precharge voltage on the bitline from the sensing circuit;

an overshoot filter circuit electrically coupled to the bitline, said overshoot filter circuit filter including means for filtering glitches on the bitline;

a current amplification circuit electrically coupled to the sensing circuit and having means for amplifying the current sensed on the bitline;

a current-to-voltage conversion circuit electrically coupled to the current amplification circuit and having means for converting the sensed current to a first voltage; and a voltage amplification circuit electrically coupled to the current-to-voltage conversion circuit and having means for amplifying the first voltage to produce a second voltage at a sense amplifier output.

14. The sense amplifier of claim 13 wherein the overshoot filter includes a first inverter which receives a bias signal indicating a glitch at an input and produces an inverted bias signal at an output, and a discharge transistor having a gate terminal electrically coupled to the output of the first inverter, a drain terminal electrically coupled to the bitline and a source terminal electrically coupled to a ground potential.

15. The sense amplifier of claim 13 wherein the precharge circuit clamps the precharge voltage on the bitline to a value that is lower than the value of the first power supply.

16. The sense amplifier of claim 13 further including a first input terminal for receiving the activation signal and a second input terminal for receiving the first power supply voltage.

17. The sense amplifier of claim 16 wherein the precharge circuit includes:

a first resistor;

a first PMOS transistor (101) having a gate electrically coupled to the first input terminal and a source terminal electrically coupled to the second input terminal;

a second PMOS transistor (102) having a source terminal electrically coupled to the drain terminal of the first PMOS transistor, and a drain terminal electrically coupled to a first end of the first resistor;

a first NMOS transistor (202) having a gate terminal electrically coupled to the bitline, a drain terminal electrically coupled to a second end of the first resistor and a source terminal electrically coupled to a ground potential;

a third PMOS transistor (103) having a gate terminal electrically coupled to the bitline, and a source terminal electrically coupled to the drain terminal of the first PMOS transistor; and a second NMOS transistor (203) having a source terminal electrically coupled to the bitline, a gate terminal electrically coupled to the second end of the first resistor, and a drain terminal electrically coupled to the drain terminal of the third PMOS transistor.

18. The sense amplifier of claim 16 wherein the sensing and current amplification circuits include:

a third input terminal for receiving a sense mode enable signal;

a fourth PMOS transistor (105) having a source terminal electrically coupled to the second input terminal;

a fifth PMOS transistor (106) having a source terminal electrically coupled to the second input terminal, a gate terminal electrically coupled to the gate terminal of the fourth PMOS transistor, and a drain terminal electrically coupled to a first voltage node (58);

a third NMOS transistor (206) having a gate terminal electrically coupled to the third input terminal, a source terminal electrically coupled to the ground potential, and a drain terminal electrically coupled to the first voltage node;

a fourth NMOS transistor (210) having a drain terminal electrically coupled to the drain terminal of the fourth PMOS transistor, a source terminal electrically coupled to the bitline; and a fifth NMOS transistor (201) having a drain terminal electrically coupled to the gate of the fourth NMOS transistor, a source terminal electrically coupled to the ground potential, and a gate terminal electrically coupled to the first input terminal to receive the activation signal.

19. The sense amplifier of claim 16 wherein the voltage amplification circuit includes:

a bias current generator circuit;

a sixth NMOS transistor (207) having a gate terminal electrically coupled to a first voltage node (58/V1), a source terminal electrically coupled to a ground potential, and a drain terminal electrically coupled to a second voltage node (68);

a sixth PMOS transistor (107) having a source terminal electrically coupled to the second input terminal, a gate terminal electrically coupled to the bias current generator circuit, and a drain terminal electrically coupled to the second voltage node.

20. The sense amplifier of claim 19 wherein the bias current generator circuit includes:

a fourth input terminal for receiving a sense mode enable signal;

a seventh PMOS transistor (108) having a drain terminal, a source terminal electrically coupled to the second input terminal, and a gate terminal electrically coupled the a drain terminal;

a seventh NMOS transistor (208) having a source terminal, a drain terminal electrically coupled to the drain terminal of the seventh PMOS transistor, and a gate terminal electrically coupled to the fourth input terminal; and an eighth NMOS transistor (209) having a drain terminal electrically coupled to the source terminal of the seventh NMOS transistor, a gate terminal electrically coupled to the second input terminal, and a source terminal electrically coupled to a ground potential.

21. The sense amplifier of claim 19 wherein the voltage amplification circuit further includes a plurality of inverters electrically coupled between the second voltage node and the sense amplifier output.

22. The sense amplifier of claim 19 further including a ninth NMOS transistor (211) having a gate terminal electrically coupled to the first input terminal, a drain terminal electrically coupled to the second voltage node, and a source terminal electrically coupled to the ground potential.

* * * * *